(12) United States Patent
Kazama

(10) Patent No.: US 6,337,572 B1
(45) Date of Patent: Jan. 8, 2002

(54) ELECTRIC CONTACT PROBE UNIT

(75) Inventor: Toshio Kazama, Nagano (JP)

(73) Assignee: NHK Spring Co., Ltd. (JP)

( * ) Notice: Subject to any disclaimer, the term of this patent is extended or adjusted under 35 U.S.C. 154(b) by 0 days.

(21) Appl. No.: 09/462,813

(22) PCT Filed: Jul. 13, 1998

(86) PCT No.: PCT/JP98/03131

§ 371 Date: Jan. 12, 2000

§ 102(e) Date: Jan. 12, 2000

(87) PCT Pub. No.: WO99/04274

PCT Pub. Date: Jan. 28, 1999

(30) Foreign Application Priority Data

Jul. 14, 1997 (JP) .............................................. 9-188587

(51) Int. Cl.⁷ ................................................. G01R 1/04
(52) U.S. Cl. ....................................... 324/754; 324/761
(58) Field of Search ................................. 324/725, 754, 324/761, 762; 439/482, 824

(56) References Cited

U.S. PATENT DOCUMENTS

| | | | |
|---|---|---|---|
| 4,931,726 A | * 6/1990 | Kasukabe et al. | ........... 324/754 |
| 5,003,255 A | 3/1991 | Kazama | ................... 324/158 P |
| 5,990,697 A | 11/1999 | Kazama | ...................... 324/761 |

FOREIGN PATENT DOCUMENTS

| | | |
|---|---|---|
| DE | 3340431 A1 | 5/1985 |
| JP | 64-71141 | 3/1989 |
| JP | 3-202780 | 9/1991 |
| JP | 6-148236 | 5/1994 |
| JP | 6-201725 | 7/1994 |
| JP | 7-115253 | 5/1995 |
| JP | 8-23013 | 1/1996 |
| JP | 8-39855 | 2/1996 |
| JP | 9-54116 | 2/1997 |
| JP | 10-19930 | 1/1998 |
| JP | 10-38920 | 2/1998 |
| JP | 10-111315 | 4/1998 |

OTHER PUBLICATIONS

F. Hobart, "Spring Plunger Contact Assembly," Western Electric Technical Digest No. 35, Jul. 1974, pp. 33–34.

* cited by examiner

Primary Examiner—Vinh P. Nguyen
(74) Attorney, Agent, or Firm—Skjerven Morrill MacPherson LLP

(57) ABSTRACT

In an electric contact probe unit using a perforated plate member as a holder member, the holder member is made of material having a low coefficient of thermal expansion so that, even when used in a high temperature environment, the thermal expansion of the holder member can be minimized so that the positional accuracy of the electric contact probe units can be ensured without creating cumulative errors between those located remote from each other. When the holder member consists of a plurality of laminated thin plate members, because the perforation of thin plate members can be accomplished by etching, the production process is suited for mass production. By forming electrically insulating film on the inner circumferential surface of the holder hole, it becomes possible to form the holder member from materials which have a low coefficient of thermal expansion but are electroconductive, thereby expanding the range of material selection.

7 Claims, 2 Drawing Sheets

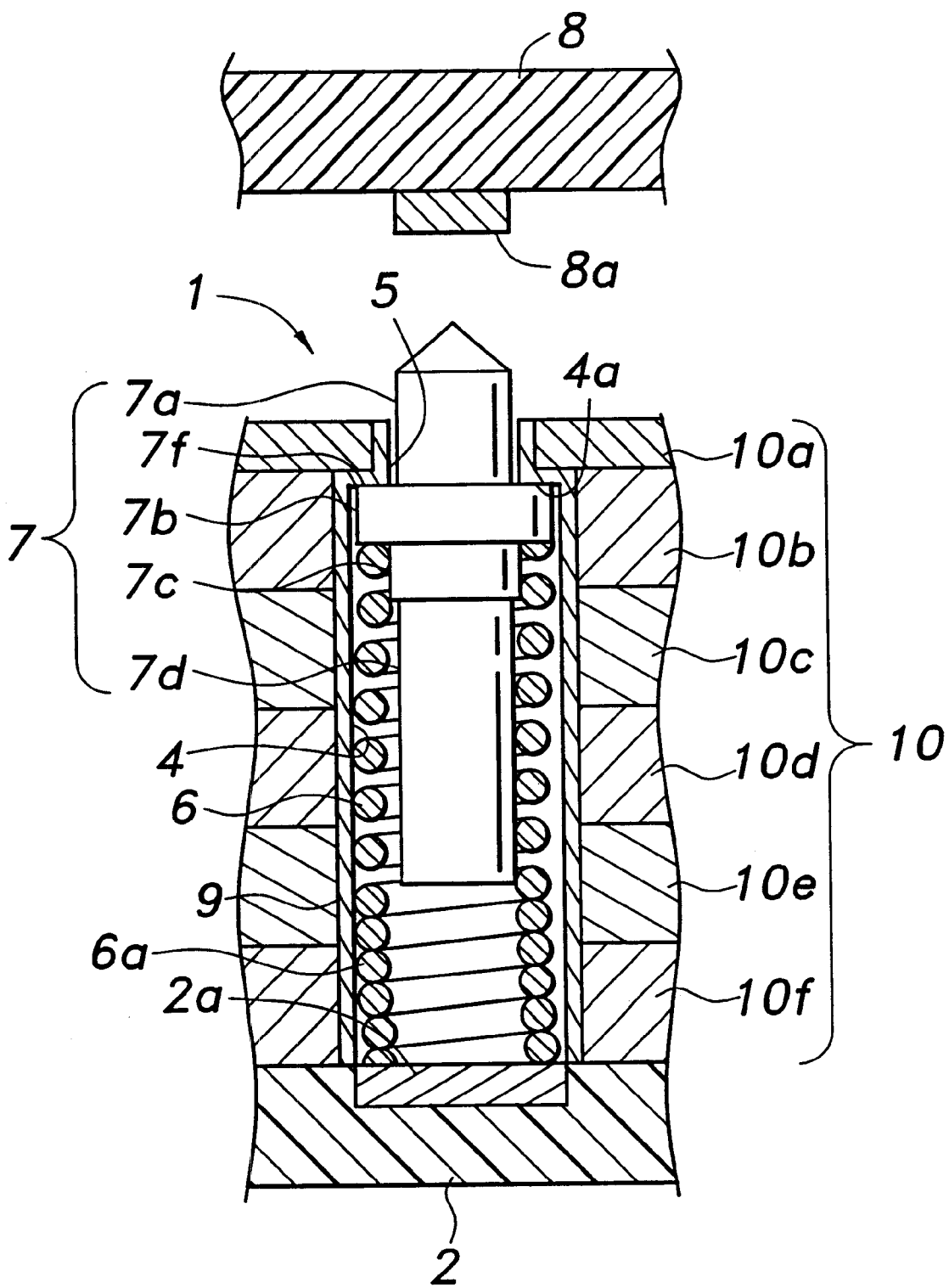

ELECTRIC CONTACT PROBE UNIT

TECHNICAL FIELD

The present invention relates to an electric contact probe unit including an electroconductive needle member which is resiliently urged by a compression coil spring, and in particular to such an electric contact probe unit which is suitable for testing printed circuit boards, semiconductor devices and semiconductor wafers.

BACKGROUND OF THE INVENTION

According to a conventionally known electroconductive contact probe unit for use in a contact probe for electrically testing electroconductive patterns of printed circuit boards and semiconductor products, each electroconductive needle member is received in a tubular holder so as to be axially slidable in and out of the holder and is resiliently urged by a compression coil spring in the direction to project out of the holder to the extent permitted by means for preventing the electroconductive needle member from completely projecting out of the holder. In such an electroconductive contact probe unit, a forward end of the electroconductive needle member is resiliently engaged by an object to be tested so that an electric signal may be transmitted between the object to be tested and an external circuit.

The applicant of this application previously proposed a contact probe unit arrangement in which a plurality of holes are passed through a plate-shaped support member as holders, and an electroconductive needle member and a compression coil spring are received in each of the holders so that a plurality of points of base boards and/or semiconductor devices may be measured or tested at the same time (Japanese patent laid-open publication No. 6-201725).

According to such an arrangement, as there is no need to prepare a tubular holder for each of the electroconductive needle members, and there is no need to prepare the holders as separate components, the spacing between adjacent electroconductive needle members can be minimized, and the contact probe can be adapted to highly densely arranged points to be tested.

To receive each electroconductive needle member and an associated compression coil spring, the plate-shaped support member is made from an electrically insulating synthetic resin plate or ceramic material. However, when the contact probe is provided with a support plate having a large area exceeding 100 mm in diameter, and is used in a high temperature environment, the relative positions of the holes (electroconductive needle members) could significantly change.

BRIEF SUMMARY OF THE INVENTION

In view of such problems of the prior art, a primary object of the present invention is to provide a contact probe unit which is adapted to be highly densely arranged and to function properly even in a high temperature environment.

A second object of the present invention is to provide a contact probe unit of a highly compact design which is economical to manufacture, and yet capable of functioning properly even in a high temperature environment.

A third object of the present invention is to provide a contact probe unit of a highly compact design which is suited for mass production, and yet capable of functioning properly even in a high temperature environment.

The present invention achieves such objects by providing an electric contact probe unit, comprising; a holder formed by a holder hole passed through a holder member including at least a single plate member, the holder hole defining a small diameter portion on a first side of the holder member; a base board placed over a second side of the holder member, the base board including a circuit pattern aligned with an end of the holder hole on the second side of the holder member; an electroconductive needle member axially slidably received in the holder hole, and including a head portion adapted to project outwardly from the small diameter portion, and an annular shoulder adapted to be engaged by a corresponding annular shoulder defined at a base end of the head portion; and a compression coil spring received in the holder hole in a coaxial relationship to the electroconductive needle member to urge the head portion out of the small diameter portion; wherein the holder member consists of material having a low coefficient of thermal expansion.

Thus, owing to the low coefficient of thermal expansion, the positional errors of the locations of the contact probe units can be minimized even in a high temperature environment. By making the holder member from a plurality of laminated thin plate members, the work of forming the holes serving as holders is simplified, and is made suitable for mass production. In this case, the small diameter portion can be conveniently formed by reducing the size of the holder hole for the outermost one of the thin plate members jointly forming the holder member.

Materials having low coefficients of thermal expansion as well as other required mechanical properties can be readily found in silicon and metallic materials. However, metallic materials are generally electroconductive, and there is a need to insulate in the holder member from the electroconductive needle member. In view of difficulty in physically forming an insulating layer as the size of each contact probe unit is reduced, it is preferable if electrically insulating film is formed by a chemical reaction of the material of the holder member. Normally, such insulating film can be formed by oxidizing the material of the holder member, or by chemical vapor deposition, among other possibilities. When the holder member is made of silicon wafer, insulating film can also be formed by chemical deposition, and the insulating film preferably consists of silicon dioxide which is highly durable and chemically stable.

Preferably, the compression coil spring consists of electroconductive material, and is adapted to conduct an electric signal from the electroconductive needle member to the circuit pattern of the base board so that any additional means for conducting electric signal from the electroconductive needle member to the base board may not be required.

BRIEF DESCRIPTION OF THE DRAWINGS

Now the present invention is described in the following with reference to the appended drawings, in which:

FIG. 2 is a view similar to FIG. 1 showing another embodiment of the electric contact probe unit according to the present invention.

DETAILED DESCRIPTION OF THE PREFERRED EMBODIMENTS

Figure 1:
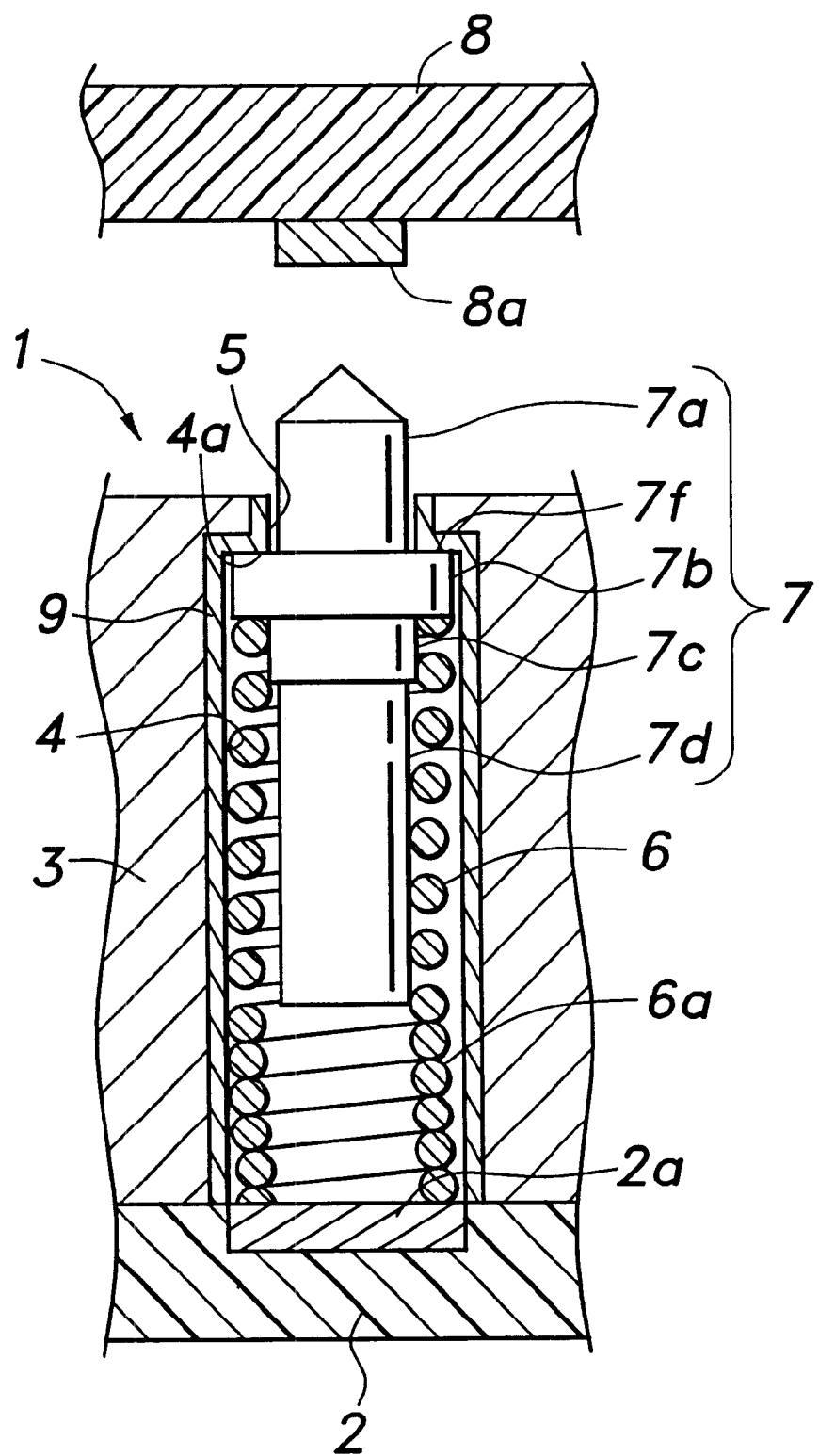
FIG. 1 is a schematic longitudinal sectional view of an electric contact probe unit according to the present invention.

FIG. 1 is a schematic longitudinal sectional view of an electric contact probe unit 1 to which the present invention is applied. Typically, a large number of such electric contact probe units are arranged one next to the other so that a plurality of points of the object to be tested may be tested simultaneously.

The lower end of this electric contact probe unit 1 as seen the drawing is placed adjacent to a base board 2 which may consist of a bum-in board or the like. The upper surface of the base board 2 carries a circuit pattern 2a which is flush with the upper surface of the base board 2. A holder member 3, consisting of a single plate member in this embodiment, is placed over the upper surface of the base board 2. The holder member 3 and the base board 2 may be integrally attached to each other by suitable fastening means such as threaded bolts.

The holder member 3 is provided with a holder hole 4 passed across the thickness of the holder member 3, and opposes the circuit pattern 2a at an end thereof. The other end of the holder hole 4 on the upper end of the holder member 3 as seen in the drawing is provided with a small diameter portion 5 in a coaxial relationship. The holder hole 4 receives therein a compression coil spring 6 having a somewhat smaller outer diameter than the inner diameter of the holder hole 4 in a substantially coaxial relationship, and the upper portion of the holder hole 4 as seen in the drawing receives a part of an electroconductive needle member 7 in a coaxial relationship.

The electroconductive needle member 7 comprises a head portion 7a coaxially received in the small diameter portion 5 so as to project out (upward as seen in the drawing) from the small diameter portion 5, a flange portion 7b having a larger diameter than the small diameter portion 5 and received in the holder hole 4, a collar portion 7c having a larger diameter than the inner diameter of the compression coil spring 6, and a stem portion 7d having a smaller diameter than the inner diameter of the compression coil spring 6, in that order, all in a coaxial relationship.

The compression coil spring 6 received in the holder hole 4 is assembled in a pre-stressed state between the base board 2 and the flange portion 7b so as to resiliently urge the head portion 7a of the electroconductive needle member 7 outwardly. Therefore, in the assembled state, the electroconductive needle member 7 is prevented from entirely coming off from the holder hole 4 by a radial annular shoulder portion 4a defined between the small diameter portion 5 and the remaining part of the holder hole 4 resiliently abutting an opposing annular shoulder 7f of the flange portion 7b. The electric connection between the electroconductive needle member 7 and the compression coil spring 6 is ensured by the upper end of the compression coil spring 6 resiliently fitting onto the collar portion 7c of the electroconductive needle member 7.

In actually testing an object 8 to be tested such as a semiconductor device by using the electric contact probe unit 1 thus assembled, the head portion 7a of the electroconductive needle member 7 is brought into contact with a terminal 8a of the object 8 to be tested to establish an electric contact between the base board 2 and the object 8 to be tested. According to the electric contact probe unit 1 of the present invention, because the compression coil spring 6 curves as it is compressed, a part of the inner circumferential surface of the compression coil spring 6 contacts the stem portion 7d. Also, the part of the compression coil spring 6 extending between the point of contact with the stem portion 7d under the rest condition (assembled state) illustrated in FIG. 1 and the coil end contacting the circuit pattern 2a consists of a closely wound coil wire.

Therefore, the electric signal is conducted from the stem portion 7d of the electroconductive needle member 7 to the circuit pattern 2a axially through the closely wound portion 6a of the compression coil spring 6. Because the electric current flows axially through the closely wound portion 6a of the compression coil spring 6 instead of the spiral path along the length of the coil wire, the electric current, in particular when its frequency is high, encounters a relatively low electric inductance and resistance.

When the terminal 8a has a flat surface as shown in the drawing, the head portion 7a of the electroconductive needle member 7 may be provided with a sharp, pointed end so that it may penetrate oxide film that may be formed over the surface of the terminal 8a, and a desired electric contact may be established. When the terminal of the object to be contacted consists of a solder ball or the like, the head portion 7a of the electroconductive needle member 7 may be provided with a flat end.

The electric contact probe unit 1 according to the present invention is suited for applications where a large number of terminals are required to be contacted and tested at the same time. Although only a single unit is illustrated in FIG. 1, a plurality of such units as the one illustrated in FIG. 1 may be arranged one next to the other in a holder member 3 having a relatively large area (100 mm in diameter or larger). When the test is required to be conducted in a high temperature environment, the holder member 3 could be affected by thermal expansion to such an extent that even though some of the electric contact probe units 1 may be aligned with the corresponding terminals, those remote from them may not be aligned with the corresponding terminals.

However, according to the present invention, the holder member 3 is made of material having a relatively low coefficient of thermal expansion such non-metallic materials as ceramics and glass, a material such as silicon, and a metallic material such as Invar. When electroconductive materials such as Invar are used for the holder member 3, because the compression coil spring 6 curves under compression, and contacts the inner circumferential surface of the holder hole 4, it is necessary to prevent conduction of electricity to the holder member 3.

According to the present invention, insulating film 9 is formed over the inner circumferential surface of the holder hole 4 and the small diameter portion 5 as shown in FIG. 1. Thus, even when the holder member consists of a material which has a low coefficient of thermal expansion but is highly electroconductive, the holder member 3 may be given with a required electrically insulating property.

The insulating film 9 may be conveniently formed by heating and oxidizing a silicon wafer. In such a case, because the holder holes may be formed by etching, forming insulating film 9 for each holder hole 4 can be done without any problem. The insulating film 9 may also consist of resin or ceramic film. Vapor deposition (such as CVD) is also suitable for forming the insulating film.

When the holder member 3 consists of non-electroconductive materials as glass and ceramics, the holder holes 4 are not required to be insulated as can be readily appreciated.

FIG. 2 is a view similar to FIG. 1 showing another embodiment of the holder member 3 in which the parts corresponding to those of the previous embodiment are denoted with like numerals. In the embodiment illustrated in FIG. 2, a plurality of thin plate members 10a to 10f are laminated one over the other to jointly form a holder member 10, and the holder hole 4 and the small diameter portion 5 are formed similarly as the embodiment illustrated in FIG. 1. More specifically, the small diameter portion 5 is formed in the upper most thin plate member 10*a* as shown in FIG. 2, and a hole of an identical diameter is formed in each of the underlying thin plate members 10*b* to 10*f* so as to jointly form the holder hole 4.

The thin plate members 10*a* to 10*f* are fixedly secured to each other by bonding using a bonding agent, diffusion bonding or brazing. The holder member 10 is thus formed by integrally attached thin plate members 10*a* to 10*f*, and insulating film 9 is formed on the inner circumferential surface of the holder hole 4 and the small diameter portion 5 to achieve the same goal as that mentioned with respect to the previous embodiment. The insulating film 9 can be formed by CVD, oxidization, or other deposition methods, and can be conducted either after the thin plate members 10*a* to 10*f* are assembled together or before they are assembled.

According to this laminated structure, because the hole is formed in each of the thin plate members, the process of forming the holder hole 4 and the small diameter portion 5 is simplified. When the material consists of Invar or silicon, because the etching work can be carried out, and forming of the holes can be carried out simultaneously, the time required for making each electric contact unit can be minimized, particularly when a large number of holes are required to be formed in each plate member and/or when mass production of electric contact probe units are required, and the overall cost can be reduced.

Thus, according to the present invention, because the holder is formed by perforating a plate member having a low coefficient of thermal expansion, even when used in a high temperature environment, the thermal expansion of the holder member can be minimized so that the positional accuracy of the electric contact probe units can be ensured without creating cumulative errors between those located remote from each other even in a high temperature environment. When the holder member consists of a plurality of thin plate members, because the perforation of thin plate members can be accomplished by etching, the production process is suited for mass production. By forming electrically insulating film on the inner circumferential surface of the holder hole, it becomes possible to form the holder member from materials which have a low coefficient of thermal expansion but are electroconductive, and the range of material selection can be expanded.

Although the present invention has been described in terms of preferred embodiments thereof, it is obvious to a person skilled in the art that various alterations and modifications are possible without departing from the scope of the present invention which is set forth in the appended claims.

What is claimed is:

1. An electric contact probe unit, comprising;
   a holder formed by a holder hole passed through a holder member including at least a single plate member, said holder hole defining a small diameter portion on a first side of said holder member;
   a base board placed over a second side of said holder member, said base board including a circuit pattern aligned with an end of said holder hole on the second side of said holder member;
   an electroconductive needle member axially slidably received in said holder hole, and including a head portion adapted to project outwardly from said small diameter portion, and annular shoulder adapted to be engaged by a corresponding annular shoulder defined at a base end of said head portion; and
   a compression coil spring received in said holder hole in a coaxial relationship to said electroconductive needle member to urge said head portion out of said small diameter portion;
   wherein said holder member consists of material selected from a group consisting of metallic materials and silicon, electrically insulating film being formed over an inner circumferential surface of said holder hole by a chemical reaction of the material of said holder member.

2. An electric contact probe unit according to claim 1, wherein said compression coil spring consists of electroconductive material, and is adapted to conduct an electric signal from said electroconductive needle member to said circuit pattern of said base board.

3. An electric contact probe unit according to claim 1, wherein said holder member is formed by laminating a plurality of thin plate members.

4. An electric contact probe unit according to claim 3, wherein one of said thin plate members on said first side of said holder member is provided with a smaller holder hole to define said small diameter portion.

5. An electric contact probe unit according to claim 1, wherein said holder member comprises a silicon wafer, and said electrically insulating film is formed by oxidizing the inner circumferential surface of said holder hole.

6. An electric contact probe unit according to claim 1, wherein said holder member comprises a silicon wafer, and said electrically insulating film is formed by a chemical vapor deposition process.

7. An electric contact probe unit according to claim 1, wherein said holder member comprises a metallic plate member, and said electrically insulating film is formed by a chemical vapor deposition process.

* * * * *